United States Patent [19]
Kallio

[11] Patent Number: 5,735,407
[45] Date of Patent: Apr. 7, 1998

[54] CONTAINER FOR PRINTED CIRCUIT BOARDS

[75] Inventor: James H. Kallio, South Barre, Mass.

[73] Assignee: North East Systems Associates, Inc., Stow, Mass.

[21] Appl. No.: 726,074

[22] Filed: Oct. 3, 1996

Related U.S. Application Data

[60] Provisional application No. 60/004,743 Oct. 3, 1995.

[51] Int. Cl.⁶ .................................................. B65D 85/86
[52] U.S. Cl. ................................ 206/707; 211/41.17
[58] Field of Search .................................. 206/449, 451, 206/453, 485, 706–709, 722, 723; 211/41.1, 41.17; 361/796, 797, 802

[56] References Cited

U.S. PATENT DOCUMENTS

| 3,247,424 | 4/1966 | Kossoy et al. | 211/41.17 |
|---|---|---|---|
| 3,327,175 | 6/1967 | Binzenhofer | 361/796 |
| 4,002,381 | 1/1977 | Wagner et al. | 211/41.17 |
| 4,323,161 | 4/1982 | Marconi | 361/797 |
| 4,324,330 | 4/1982 | Durney | 206/708 |
| 4,538,211 | 8/1985 | Bertellotti et al. | 211/41.17 |
| 5,353,198 | 10/1994 | Kabat et al. | 211/41.17 |
| 5,490,011 | 2/1996 | Pernick et al. | 211/41.1 |

FOREIGN PATENT DOCUMENTS

| 2714562 | 10/1978 | Germany | 361/796 |

*Primary Examiner*—Jimmy G. Foster
*Attorney, Agent, or Firm*—Blodgett & Blodgett, P.C.

[57] ABSTRACT

A container or "card cage" for rectangular printed circuit boards. The container includes a pair of rectangular vertical end caps which are removably connected by horizontal beams. The horizontal beams have spaced transverse slots for receiving the corners of printed circuit boards and for supporting the printed circuit boards within the enclosure in a spaced relationship. In one form of the container, each beam comprises a rigid connecting rail which is removably connected to the end caps and a spacing rail which is slidably mounted on the rigid connecting rail for longitudinal movement between an inner position within the container and an outer position substantially outside of the container with one of the end caps removed. Each spacing rail contains the transverse slots for receiving the printed circuit boards.

18 Claims, 11 Drawing Sheets

CONTAINER FOR PRINTED CIRCUIT BOARDS

CROSS-REFERENCE TO RELATED APPLICATIONS

This application is a continuing application of provisional application Ser. No. 60/004,743, filed Oct. 3, 1995.

STATEMENT REGARDING FEDERALLY SPONSORED RESEARCH OR DEVELOPMENT

This invention has been created without the sponsorship or funding of any federally sponsored research or development program.

BACKGROUND OF THE INVENTION

The present invention is directed to an enclosure or "card cage" for printed circuit boards.

In commercial electronics packaging involving multiple printed circuit board assemblies there are two basic concepts regarding the electrical interconnect of these modules.

The first concept involves a printed circuit board backplane to which printed circuit board modules plug into making electrical connection for the application specific power, ground, and signals. These electrical connections may be from a module to the backplane or from module to module through the backplane. This first concept typically involves a mechanical structure called a card cage to which the backplane is attached. A basic card cage also provides a means of guiding/aligning modules to the backplane to assure proper installation and electrical contact between the modules and the backplane. Individual printed circuit board modules may be removed/installed from this card cage and backplane assembly as needed for system expansion or module repair.

The second concept has been driven by the need to reduce cost and physical size of assemblies involving multiple printed circuit board assemblies. This has been accomplished by IEEE standard PC/104 by specifying a small printed circuit board outline (3.55"×3.775") and by eliminating the printed circuit board backplane. Electrical connections are made between modules by stacking connectors. Each printed circuit board module is connected to all other modules in an assembly through a common 104 pin connector. There are many commercially available PC/104 module assemblies including, CPU's, Disk Drives, PCM-CIA Headers, Ethernet Cards, ... etc.

The standard assembly method for stacking PC/104 type modules is to install a steel or nylon stand-off at each of four mounting holes per board. This involves a lot of loose and small hardware to be hand assembled. Any time a PC/104 stacked assembly needs a module replaced, this hardware has to be removed in reverse order and then re-assembled. This is a labor intensive problem and an objection with PC/104 type assemblies.

There is no commercially available "card cage" to mount stacked printed circuit board modules such as PC/104's. Custom mechanical enclosure designs are fabricated on an application specific basis. This results in increased time to market for new products and most likely increased product cost when compared to a standard off the shelf solution.

I/O cabling, which exits in any of the three remaining directions from the stacking connectors of PC/104 type modules has made conventional "card cages" non-functional for this application. These and other difficulties experienced with multiple printed circuit board assemblies have been obviated by the present invention.

It is, therefore, a principal object of the present invention to provide an enclosure for a plurality of printed circuit boards which securely supports the printed circuit boards in a predetermined spaced relationship.

A further object of the invention is the provision of an enclosure for a printed circuit board which is adaptable for changing the spacing between printed circuit boards.

Anther object of the invention is to provide an enclosure for printed circuit boards which enables the printed circuit boards to be mounted within the enclosure quickly and easily.

A still further object of the invention is the provision of an enclosure for printed circuit boards which has a minimum of parts, is simple in construction, easy to manufacture, and easy to use.

BRIEF SUMMARY OF THE INVENTION

In general, the invention consists of an container or "card cage" for rectangular printed circuit boards. The container includes a pair of rectangular vertical end caps which are removably connected by horizontal beams. The horizontal beams have spaced transverse slots for receiving the corners of printed circuit boards and for supporting the printed circuit boards within the container in a spaced relationship. In one form of the invention, each beam comprises a rigid connecting rail which is removably connected to the end caps and a spacing rail which is slidably mounted on the rigid connecting rail for longitudinal movement between an inner position within the container and an outer position substantially outside of the container, with one of the end caps removed. Each spacing rail contains the transverse slots for receiving the printed circuit boards. The printed circuit boards are positioned in a spaced stack on the spacing rails outside of the enclosure. The stack of printed circuit board and spacing rails are moved as a unit on the connecting rails within the container. Thereafter, the end cap which had been removed is connected to the rigid connecting rails.

In another form Of the invention, each end cap comprises a lower end cap potion which is connected to two lower horizontal beams and an upper end cap potion which is connected to an upper horizontal beam. The upper end cap portion is pivotally connected to the lower cap potion for movement between an open position wherein printed circuit boards can be inserted into the enclosure in register with the transverse slots of the lower horizontal beams and a closed position, wherein the upper horizontal beams engage the upper corners of the printed circuit boards. More specifically, one of the upper horizontal beams is a snugging beam which does not have transverse slots and has a resiliently deformable inwardly facing surface for engaging an upper corner of each printed circuit board and for biasing the printed circuit boards toward the other three horizontal beams and maintaining the printed circuit boards snugly within the container.

DETAILED DESCRIPTION OF THE INVENTION

Figure 1:
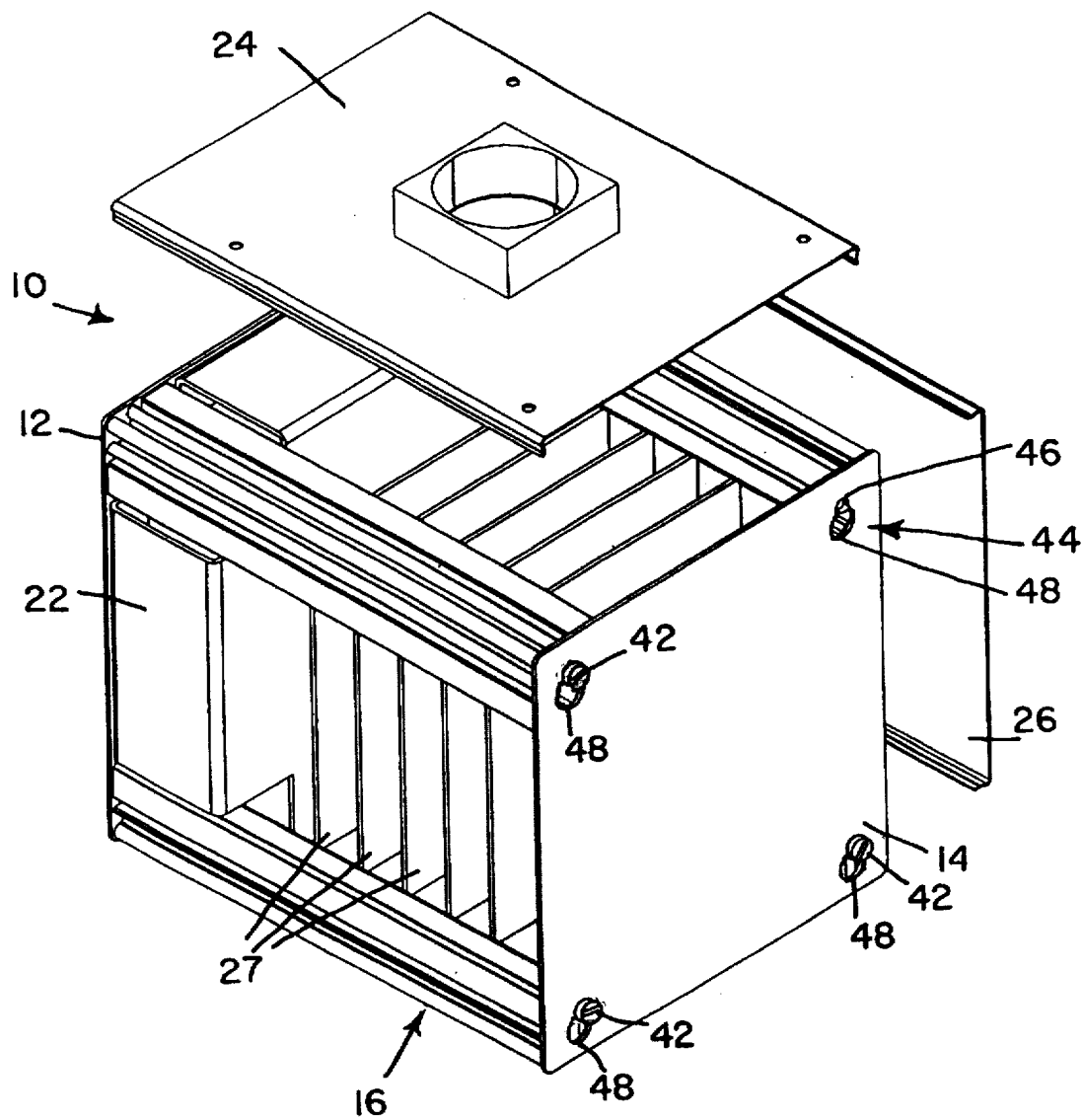
FIG. 1 is an isometric view of a container for printed circuit boards embodying the principles of the present invention and containing a plurality of printed circuit boards.
Figure 2:
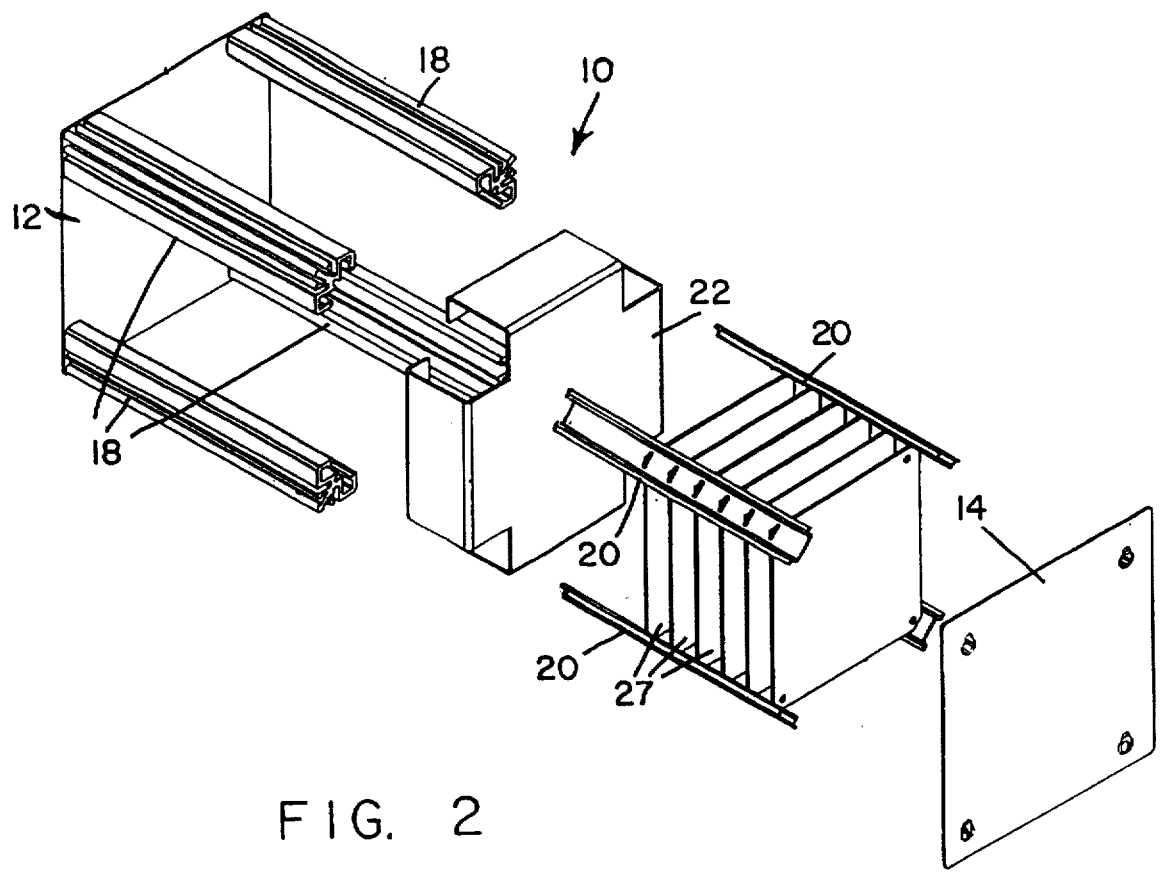
FIG. 2 is an exploded isometric view of the container for printed circuit boards and the printed circuit boards.

Referring first to FIGS. 1 and 2, there is shown the general features of a first embodiment of a container for printed circuit boards, said container being generally indicated by the reference numeral 10. The container 10 includes a vertical rectangular first end cap 12, and a vertical rectangular second end cap 14 which is substantially the same size as the first end cap 12. The first and second end caps 12 and 14, respectively, are removably connected to the opposite ends of the plurality of horizontal beam.% generally indicated by the reference numeral 16. The container 10 includes four beams, one for each corner of the first and second end caps 12 and 14, respectively, and are connected to the end caps by self threading sheet metal screws 42. The container 10 may optionally include a fan assembly 24 and one or two snap-on side covers 26.

Figure 3:
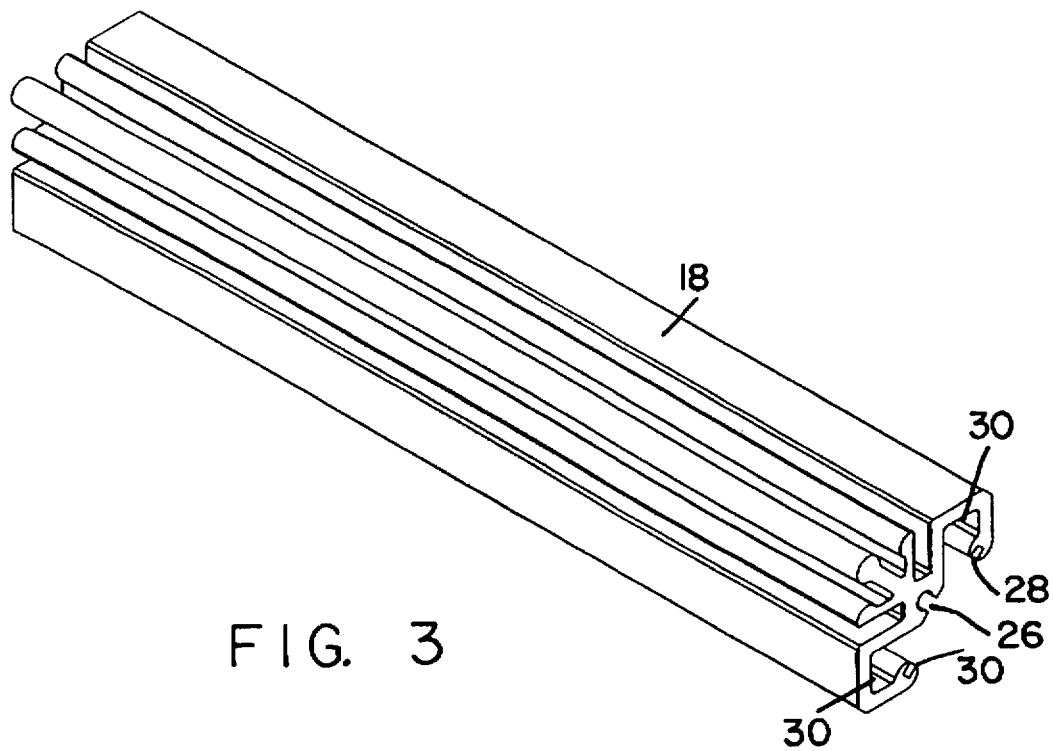
FIG. 3 is an isometric view of one of the rigid connecting rails which connect the two end caps of the container.
Figure 4:
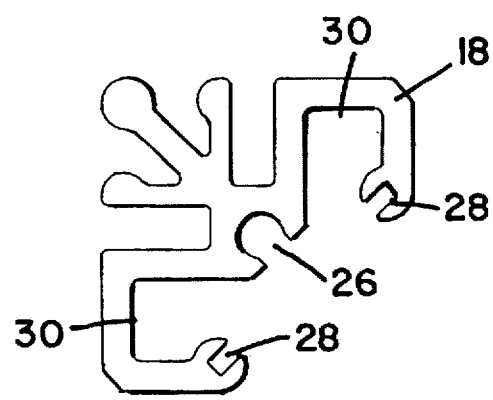
FIG. 4 is end elevational view of the rigid connecting rail.
Figure 5:
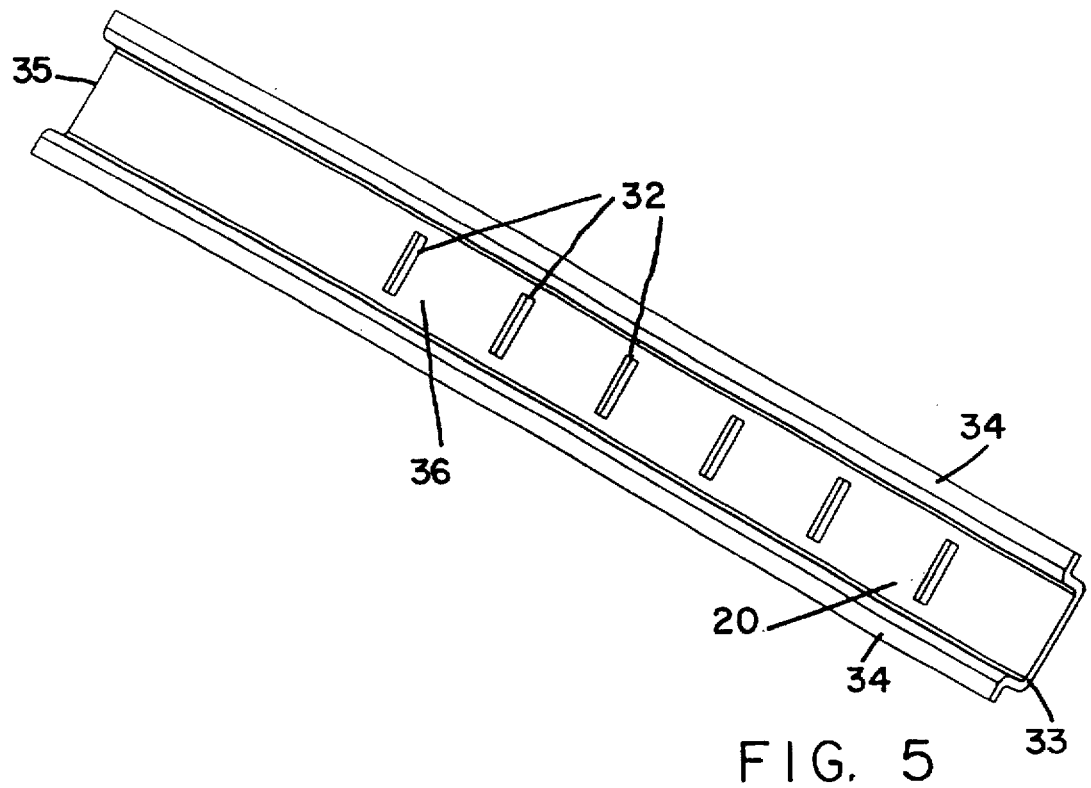
FIG. 5 is an isometric view of a slotted spacing rail which is slidably mounted on the rigid connecting rail.
Figure 9:
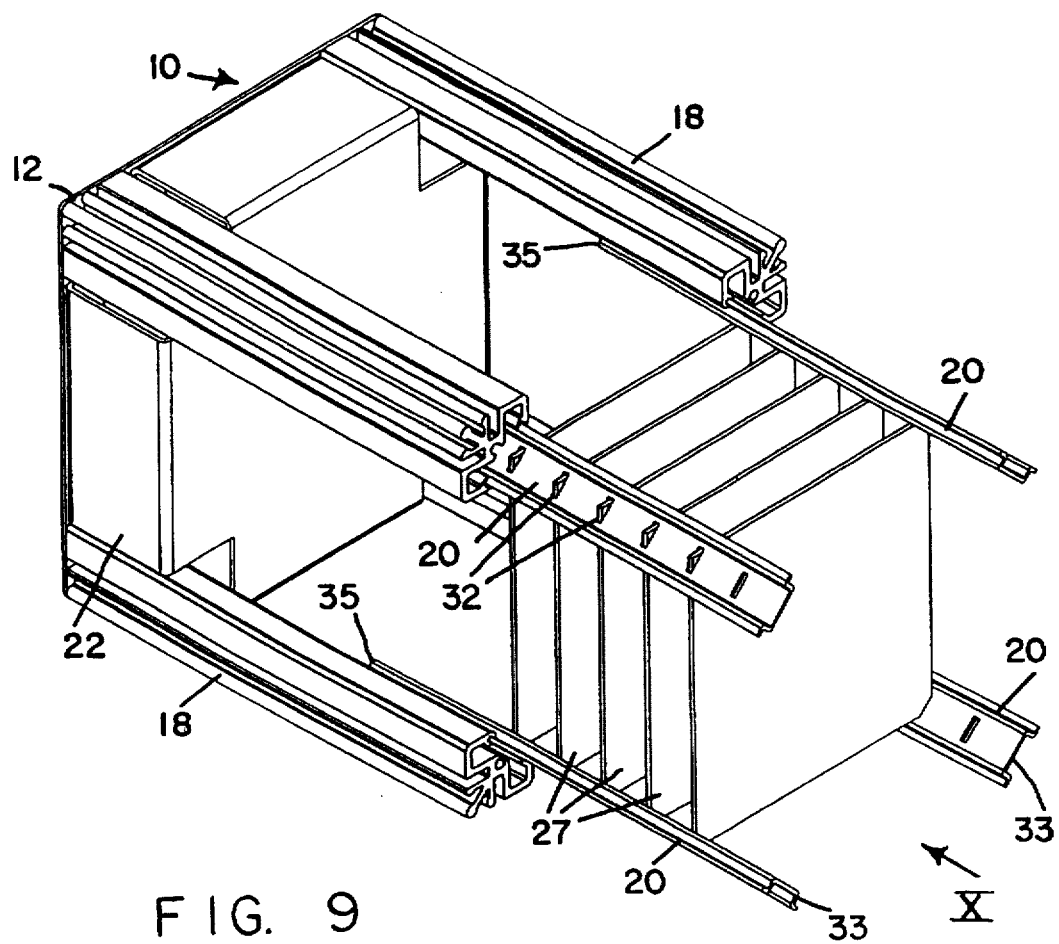
FIG. 9 is an isometric view of the container with the second end cap removed and the spacing rails extending beyond the rigid connecting rails and shown supporting a plurality of printed circuit boards.
Figure 10:
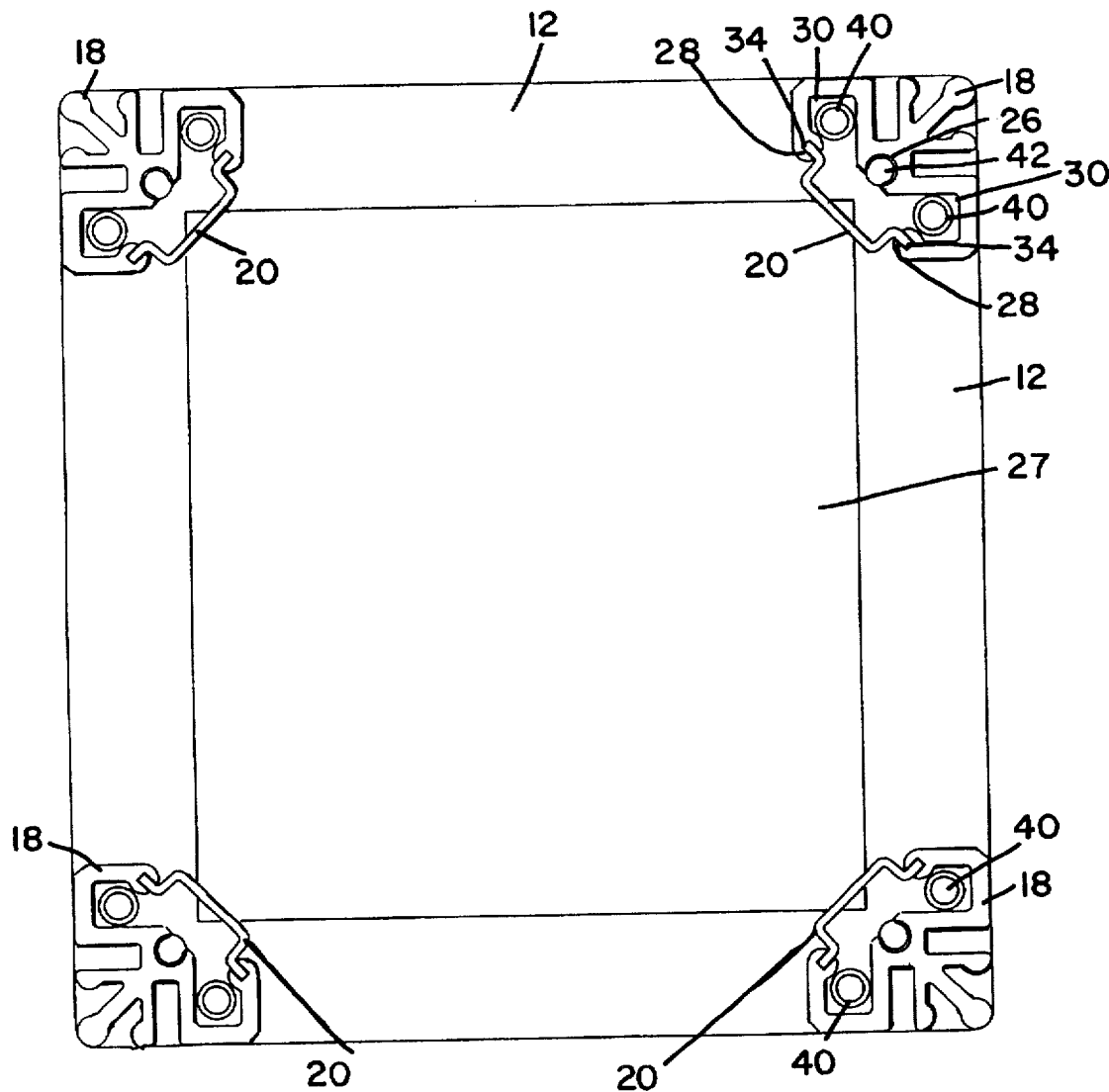
FIG. 10 is an end elevational view looking in the direction of arrow X of FIG. 9.

Referring to FIGS. 3–5, each beam 16 comprises a rigid connecting rail 18 and a spacing rail 20 which is slidably mounted on the connecting rail 18. The connecting rail 18 is an extruded piece of metal, such as aluminum, which has a central circular groove 26 for receiving the screws 42, a pair of opposed inwardly facing grooves 28, and a pair of grooves 30. The spacing rail 20 has a central flat wall 36 which containing a plurality of transverse slots 32 and a pair of opposite laterally and outwardly facing flanges 34. The flanges 34 fit into the grooves 28 of the connecting rail 18 for enabling the spacing rail 20 to slide longitudinally relative to the connecting rail 18, as shown in FIGS. 9 and 10. When the spacing rail 20 is slidably mounted on the connecting rail 18, the wall 36 is at a 45∝ angle and faces toward the center of the container 10, as shown in FIGS. 9 and 10. The slots 32 receive the corners of the printed circuit boards 27 for supporting the printed circuit boards in a spaced relationship, as shown in FIGS. 1 and 9. The end caps 12 and 14 are made of sheet metal. The spacing rail 20 is preferably made of a thermoplastic material which is sufficiently rigid to enable the spacing rail to be self supporting while being substantially resiliently flexible. The spacing rail 20 has an inner end 35 and an outer end 33. The outer end 33 is substantially closer to the outermost slot 32 than the inner end 35 is to the innermost slot 32. The spacing rails can be easily replaced with similar spacing rails in which the transverse slots have different spacing to accommodate a different set of printed circuit boards. The spacing rails are simple and inexpensive so that different sets of rails can be provided to accommodate a plurality of printed circuit board arrangements.

Figure 6:
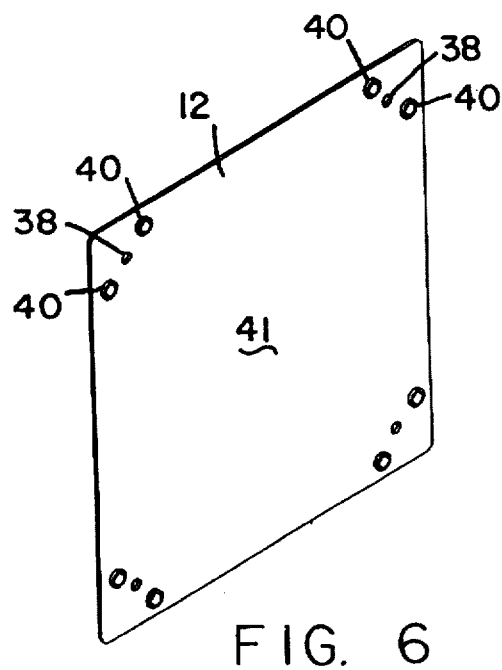
FIG. 6 is an isometric view of a first end cap of the container.

Referring to FIG. 6, the first end cap 12 has an aperture 38 adjacent each corner of the end cap for receiving the screws 42. The inwardly facing surface of the end cap 12, indicated by the reference numeral 41, has a pair of projections 40 for registering with the grooves 30 in the connecting rail 18 for accurately positioning the connecting rails 18 relative to the first end cap 12 so that when the spacing rails 20 are slidably mounted on the connecting rails 18, the walls 36 will be at 45' relative to the container, as shown in FIGS. 9 and 10.

Figure 7:
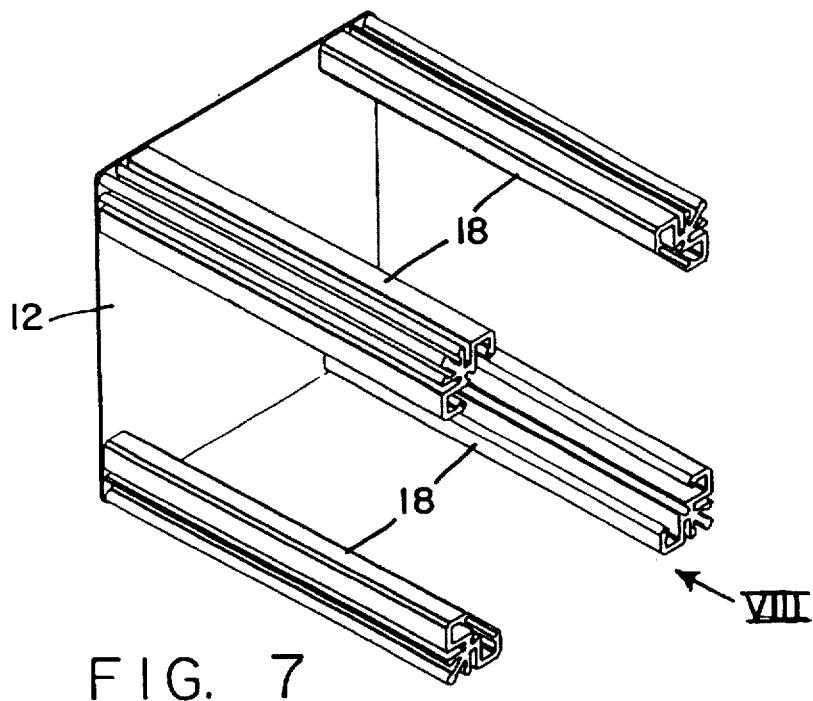
FIG. 7 is an isometric view of the rigid connecting rails connected to one a first end cap.
Figure 8:
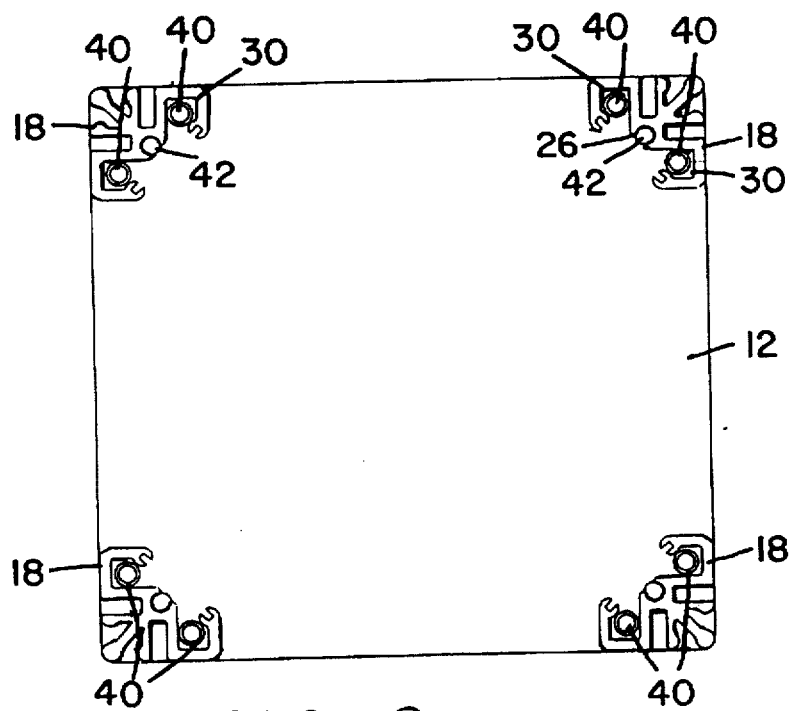
FIG. 8 is an end view looking in the direction of arrow VIII of FIG. 7.

Referring to FIGS. 7 and 8, the container 10 of the present invention is assembled by positioning one end of each connecting rail 18 against the inner surface 41 of the first end cap 12 at the four corners of the end cap so that the projections 40 extend into the grooves 30 to properly orient the connecting rails 18 relative to the first end cap 12, as shown in FIGS. 7 and 8. The connecting rails 18 are fixed to end cap 12 by screwing one of the self tapping sheet metal screws 42 into one end of the central groove 26 of each connecting rail 18. The power supply assembly is inserted into the enclosure within the confines connecting rails 18 so that it abuts the end cap 12, as shown in FIG. 9. The spacing rails 20 are then inserted into the connecting rails 18. The inner end 35 of each spacing rail 20 is axially aligned with its corresponding connecting rail 18 so that the flanges 34 are axially aligned with the grooves 28. The inner end 35 of each spacing rail 20 is partially inserted into its corresponding groove 28 so that the spacing rail extends substantially outside of its corresponding connecting rail and all of its slots 32 are located outside of the connecting rail 18, as shown in FIG. 9. The flanges 34 have sufficient clearance within their corresponding grooves 28 to permit some outward deflection of the spacing rails. This enables the printed circuit boards to be positioned within the confines of the extending spacing rails so that the corners of the printed circuit boards extend into the slots 32 of the spacing rails, as shown in FIG. 9. The fact that each spacing rail 20 is resiliently deflectable also enables the spacing rails 20 to be bent outwardly for enabling the printed circuit boards 27 to be positioned within the confines of the extending spacing rails 20. After all of the printed circuit boards 27 have been positioned on the spacing rails 20, the spacing rails and printed circuit boards are moved longitudinally as a unit within the confines of the connecting rails 18. The second end cap 14 is then positioned against the ends of the connecting rails 18 and secured by the screws 42. Preferably, the screws 42 are partially threaded into the grooves 26 and the end cap 14 is positioned against the connecting rails 18 so that the heads of the screws 42 extend through the large portions 48 of the apertures 44. The end cap 14 is then shifted downwardly so that the shank portions of the screws 42 extend into the smaller portion 46 of the apertures 44 to position the second end cap 14 in its final orientation relative to the connecting rails 18. Thereafter, the screws 42 are tightened to secure the end cap 14 to the connecting rails 18.

If appropriate, the fan assembly 24 and snap on covers 26 are added to the container 10.

MODIFICATION OF FIRST EMBODIMENT

Figure 11:
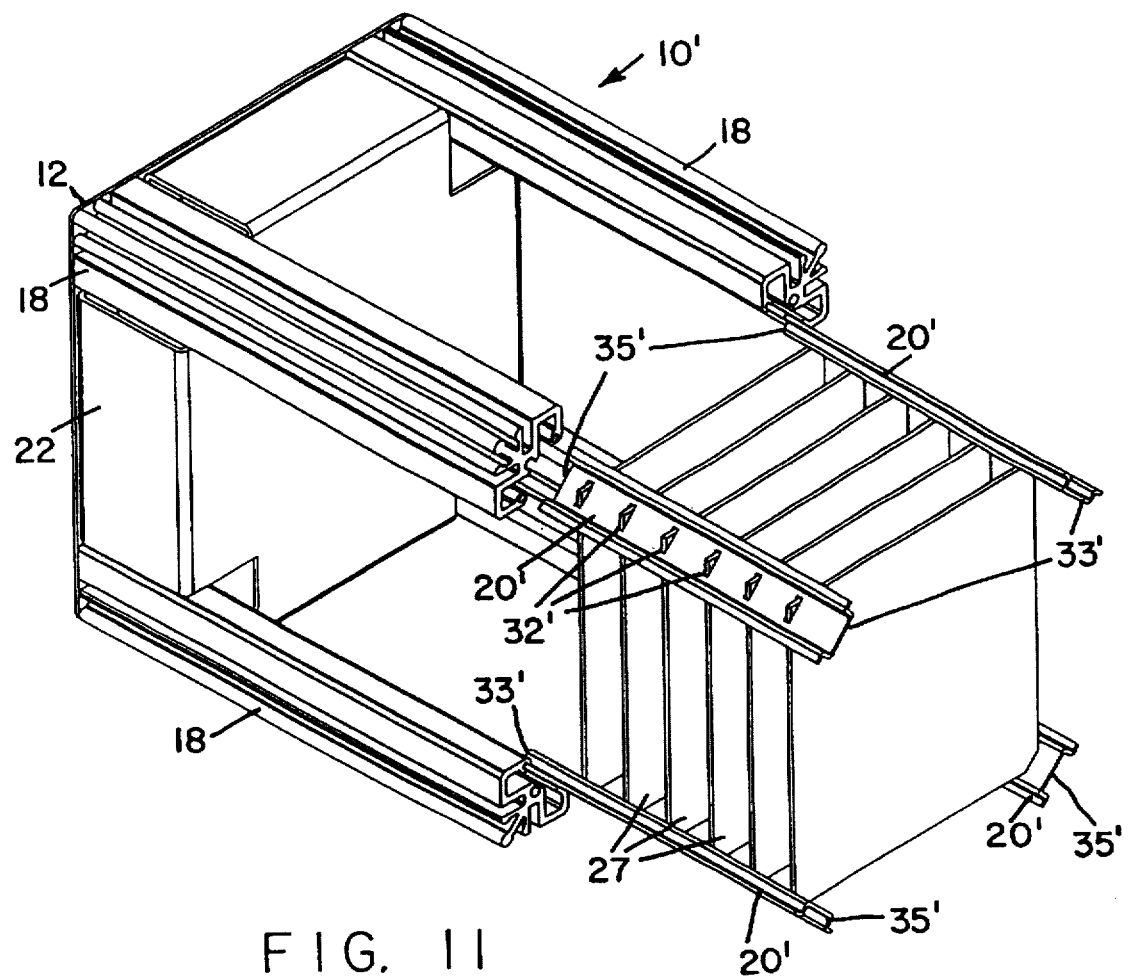
FIG. 11 is an isometric view of a modified container for printed circuit boards and containing a plurality of printed circuit boards.

Referring to FIG. 11, there is shown a modification to the first embodiment which is represented by container 10'. Container 10' is identical to container 10 except for the spacing rails which are indicated by the reference numeral 20'. The spacing rails 20' are identical to the spacing rails 20 except that the inner end of each spacing rail, indicated by the reference numeral 35', is substantially closer to the slots 32' than the outer end 33' of the spacing rail. The outer end 33' of the spacing rail 20' is spaced the same distance from its first adjacent slot 32' as the outer end 33 of the spacing rail 20 is spaced from its first adjacent slot 32.

The container 10' is assembled in the same manner as container 10 except that the bottom rails 20' are reversed 180° relative to the upper rails 20'. The outer end 33' of each bottom rail 20' is inserted first into the connecting rail 18 so that the slots 32' are located outside of the end of the connecting rails 18. The printed circuit boards 27 are applied to the slots 32' on the lower spacing rails 20'. Thereafter, the upper spacing rails 20' are positioned on the printed circuit boards 27 so that the ends 33' extend outwardly and the upper corners of printed circuit boards 27 extend into the slots 32', as shown in FIG. 11. Since the ends 35' of the upper spacing rails 20' are substantially closer to the slots 32', the ends 35' are spaced from the ends of the connecting rails 18. The entire package of spacing rails 20' and printed circuit boards 27 are pushed inwardly toward the end cap 12 so that the lower spacing rails 20' slide inwardly along the connecting rails 18 until the ends 35' of the upper spacing rails 20' come into contact with the ends of the connecting rails 18. At this point, the ends 35' of the upper spacing rails 20' enter the corresponding grooves 28 of the upper connecting rails 18 and the entire package of spacing rails 20' and printed circuit boards 27 can complete their inward movement along the connecting rails 18 until the package is located entirely within the confines of the connecting rails 18. The second end cap 14 is then applied to the ends of the connecting rails 18 in the same manner as for the container 10.

SECOND EMBODIMENT OF THE INVENTION

Referring to FIGS. 12-15, there is shown a second and preferred embodiment of a container for printed circuit boards, generally indicated by the reference numeral 60. Container 60 comprises a first vertical end cap, generally indicated by the reference numeral 62, and a second vertical end cap, generally indicated by the reference numeral 64. The end caps 62 and 64 are connected together in a spaced relationship by a pair of lower horizontal beams 66. The beams 66 are removably connected to the first and second end caps 62 and 64, respectively, by self lapping sheet metal screws 68.

Each vertical end cap 62 and 64 comprises a lower end cap portion 70 which is connected to the lower beams 66 and an arm or upper end cap portion 72. The rear end of the upper end cap portion 72 is pivotally connected to the upper top rear end of the lower end cap portion 70 by a pivot pin 74. An upper horizontal beam 76 which is identical to the beams 66 is removably connected to the freely extending forward ends of the upper end cap potion 72 by meaning of screws 68. Each of the beams 78 and 66 hag a plurality of spaced transverse slots 78 for receiving the corners of printed circuit boards 27. A snugging beam 80 is fixed to the rear end of the upper end cap potion 72. The snugging beam 80 comprises a rigid rail 81 which is fixed at its ends to the upper end cap portions 72 and a strip 82 of resiliently deformable material such as foam robber which is fixed to the inwardly facing side of the rail 81.

Figure 12:
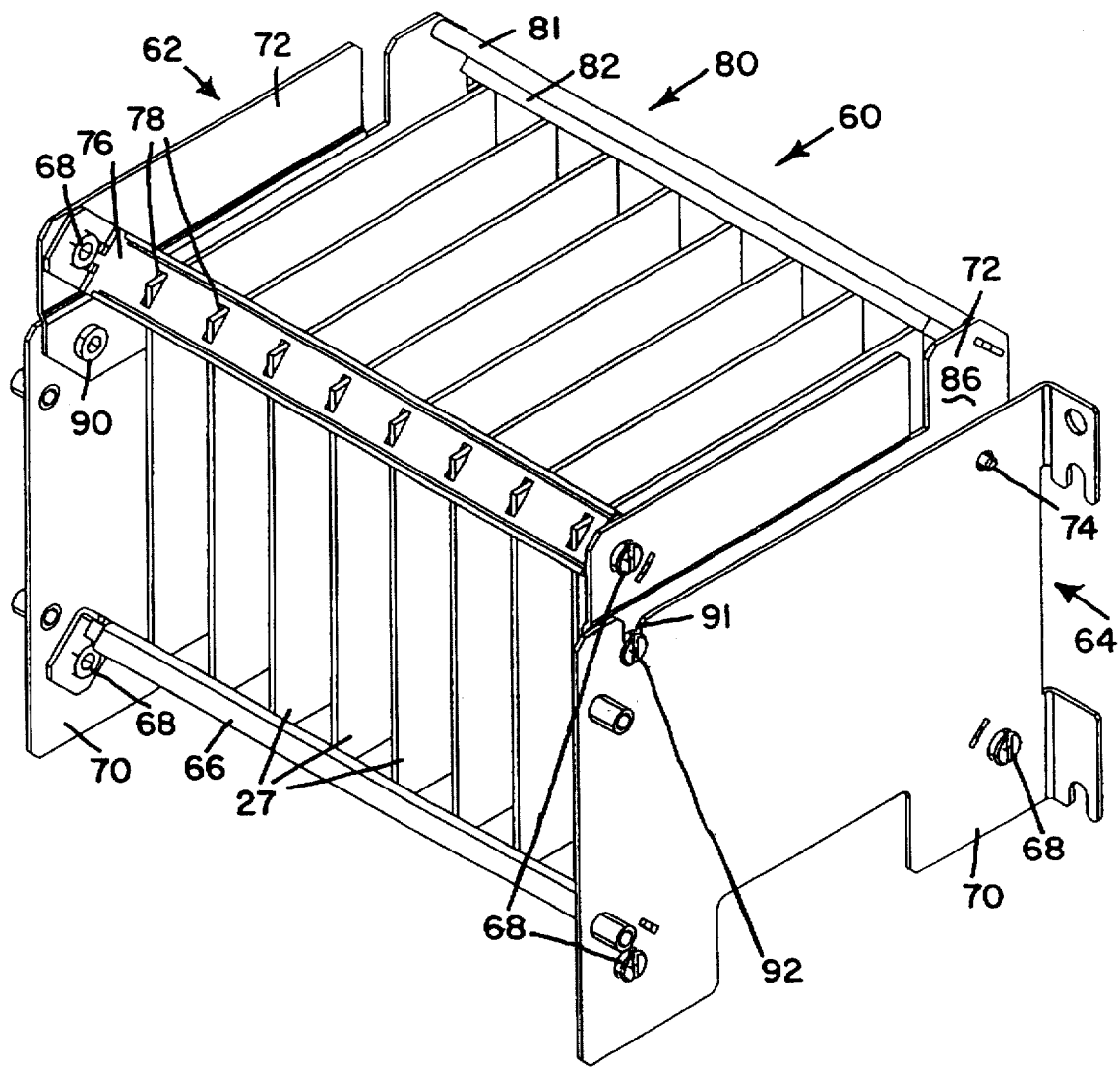
FIG. 12 is an isometric view of a second embodiment of the invention, shown in a closed position and containing a plurality of printed circuit boards.
Figures 13, 14:
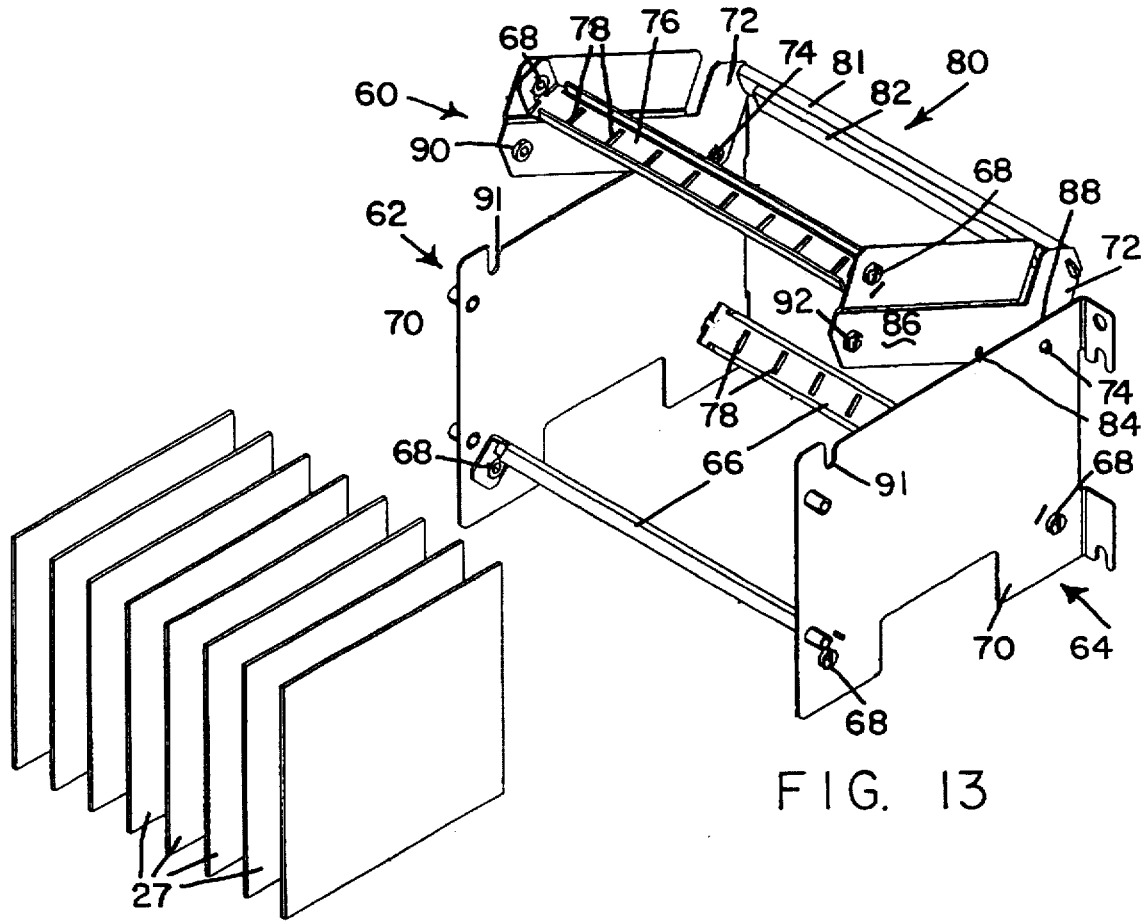
FIG. 13 is an isometric view of the second embodiment, shown in an open position for receiving printed circuit boards.
FIG. 14 is an isometric view of a stack of printed circuit boards.
Figure 15:
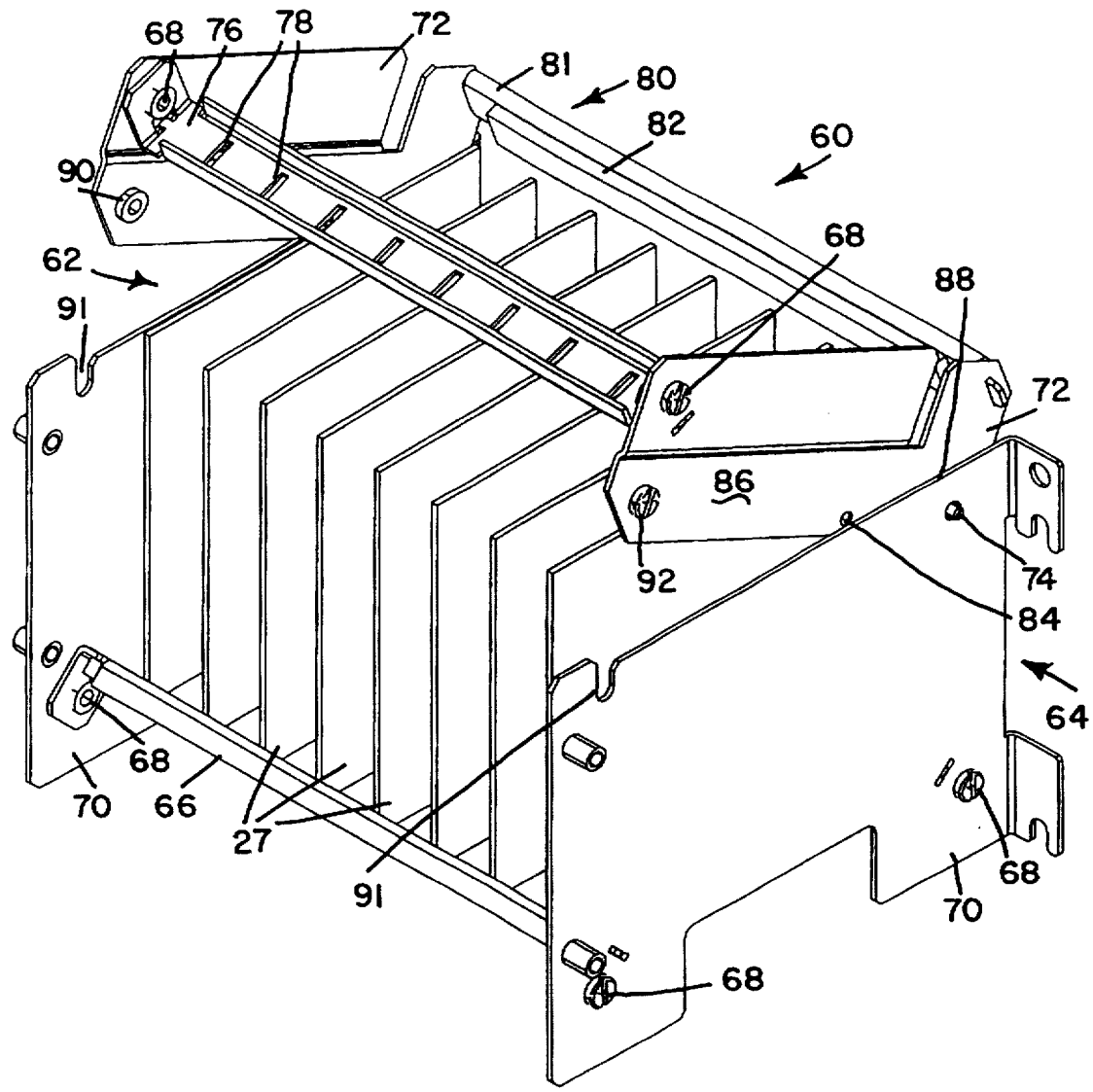
FIG. 15 is an isometric view showing the stack of printed circuit boards of FIG. 14 inserted into the container of FIG. 13 and the container in an open position.

The upper end cap portions 72 are pivotally mounted on the lower end cap portions 70 for pivoting movement between an open position shown in FIG. 13 to a closed position shown in FIG. 12. Each upper end cap 72 is located adjacent the inwardly facing surface of the lower end cap portion 70. Each upper end cap portion 72 has an outwardly facing projection 84 on its outwardly facing surface 86 for engaging the upper edge 88 of the lower end cap portion 70 when the upper end cap portions 72 are in their upper or open positions, as shown in FIG. 13, for supporting the upper end cap portions 72 in their open position. There is sufficient flexibility in the upper and lower end cap portions 60 to enable the upper end cap potion 72 to overcome the resistance of the projections to downward movement and to be pushed downwardly to its closed position.

When the container 60 is in its open position, as shown in FIG. 13, printed circuit boards 27 can be inserted into the container so that the lower corners of the printed circuit boards are located in the slots 78 of the bottom beams 66. Thereafter, the upper end cap portions 72 are pushed downwardly to the closed position so that the upper beam 76 engages the top of the printed circuit boards 27 and the upper corners of the circuit boards extend into the slots 78. At the same time, the resiliently deformable strips 82 of the snugging beam 80 engages the opposite upper corner of each circuit board and biases the circuit board toward the beams 76 and 66. This maintains the printed circuit boards 27 snugly and seemly within the confines of the container 60. It is also contemplated that one of the spacing railing 20 of the embodiment 10 can be modified to have a resiliently deformable surface which does not have slots for biasing the printed circuit boards toward the other three spacing rails. This resiliently deformable surface can be achieved by attaching a strip such as the strip 82 to the spacing rail 20.

The upper edge 88 of each lower end cap 70 has a slot 91 at the forward end of the end cap for receiving a screw 92 at the forward end of the adjacent upper end cap potion 72. A circular nut 90 is fixed to the inner surface of each upper end cap potion 72 so that when the upper end cap portions 72 are moved to the closed position, the shanks of the screws 92 enter the slots 91. The head of each screw 92 lies adjacent to the outer surface of its corresponding lower end cap portion. The screws 92 are then tightened to secure the upper end cap portions to the lower end cap portions. The screws 92, nuts 90, and slots 91 thereby constitute means for releasably locking the upper end cap portions 72 to the lower end cap portions 70.

What is claimed is:

1. A container for vertical rectangular printed circuit boards having two upper corners and two lower corners, said container comprising:

(a) a vertical first end cap;

(b) a vertical second end cap spaced from said first end cap, each of said first and second end caps having an upper forward corner, on upper rearward corner, a lower forward corner and a lower rearward corner;

(c) a horizontal first lower beam connected to the lower forward corner of said first end cap and a second end connected to the lower forward corner of said second end cap;

(d) a horizontal second lower beam having a first end connected to the lower rearward corner of said first end cap and a second end connected to the lower rearward corner of said second end cap, each of said first and second lower beams having a plurality of spaced transverse slots for receiving the two lower corners of a plurality of printed circuit boards and supporting the printed circuit boards and supporting the printed circuit boards on said first and second lower beams;

(e) a first arm having a front end and a back end, the back end of said first arm being pivotally connected to the upper rearward corner of said first end cap;

(f) a second arm having a front end and a back end, the back end of said second arm being pivotally connected to the upper rearward corner of said end cap; and (g) a horizontal upper beam having a first end and a second end, the first end of said upper beam being connected to the front end of said first arm, the second end of said upper beam being connected to the front end of said second arm, said upper beam having a plurality of spaced transverse slots, said upper beam and said first and second arms being pivotally movable as a unit between an open position in which said upper beam is positioned above said printed circuit boards and a closed position in which said upper beam engages said printed circuit boards so that the upper corners of said printed circuit board which are directly above said first lower beam enter the transverse slots of said upper beam for securing said printed circuit boards within said container.

2. A container as recited in claim 1, wherein said container further comprises a horizontal snugging beam connected to the back ends of said first and second arms for engaging the upper corners of said printed circuit boards which are directly above said second lower beam, said snugging beam having a resiliently deformable inwardly facing surface for biasing said printed circuit boards toward said upper and lower beams.

3. A container as recited in claim 2, wherein said snugging beam comprises:

(a) a rigid rail fixed to the first and second arms; and (b) a strip of resiliently deformable material fixed to said rigid rail and providing said resiliently deformable surface.

4. A container as recited in claim 1, wherein at least one of said first and second arms comprises a catch for releasably holding said upper beam and said first and second arms in said open position.

5. A container as recited in claim 4, wherein each of said first and second end caps has a top edge and said catch is a detent fixed to at least one of said first and second arms for engaging one of said top edges, said detent being adapted to be forced out of holding engagement with said one top edge by a predetermined downward pressure.

6. A container as recited in claim 1, wherein said container further comprises releasable locking means for releasably securing said first and second arm in their closed position relative to said first and second end caps.

7. A container for rectangular printed circuit boards, said container comprising:

(a) a rectangular vertical first end cap;

(b) a rectangular vertical second end cap which is substantially the same size and shape as said first end cap and spaced from said first end cap, each of said first and second end caps having a pair of opposite upper corners and a pair of opposite lower corners; and (c) at least two elongated horizontal beams for connecting said fast and second end caps, each of said horizontal beams having a first end and a second end, said horizontal beams being connected at their first ends to diagonally opposite upper and lower corners of said first end cap, and at their second ends to diagonally opposite upper and lower corners of said second end cap so that said horizontal beams are parallel, each of said horizontal beams having a plurality of spaced vertical slots for receiving the corners of printed circuit boards and far supporting said printed circuit boards within said container, each of said horizontal beams comprising:

(1) a rigid connecting rail which has a first end connected to said first end cap and a second end removably connected to said second end cap, said rigid connecting rail having at least one longitudinal guide slot; and (2) a spacing rail which is slidingly mounted in the longitudinal guide slot of said rigid connecting rail for longitudinal movement between a closed position between the first and second ends of said connecting rail to an open position in which at least a substantial portion of said spacing rail is beyond the second end of said connecting rail when said second end cap is removed from the second ends of said connecting rails, said spacing rail having transverse vertical slots far supporting a plurality of printed circuit boards outside of said container when each spacing rail is in its open position and for supporting said printed circuit boards within said container when each spacing rail is in the closed position, thereby enabling said horizontal beams to be connected to said second end cap.

8. A container as recited in claim 7, wherein each of said spacing rails is sufficiently rigid to be self supporting and sufficiently resiliently yieldable for being bent outwardly to receive said printed circuit boards while said spacing rail is connected to its corresponding rigid connecting rail.

9. A container as recited in claim 7, wherein there is sufficient clearance between each spacing rail and its corresponding rigid connecting rail within its corresponding guide slot to enable the spacing rails to be deflected outwardly for receiving said printed circuit boards.

10. A container as recited in claim 7, wherein there are four of said horizontal beams, one of said horizontal beams for each corner of the first and second end caps.

11. A container as recited in claim 7, wherein each of said horizontal beams is connected to said end caps by a screw which has a threaded shank portion and a head portion, said second end caps having an aperture at said two diagonally opposite corners, each of said apertures having a relatively small portion which is larger than said shank portion and smaller than said head portion and a contiguous large portion which is larger than said head portion which enables said second end cap to be applied to said horizontal beams while said screws are connected to said horizontal beams.

12. A container as recited in claim 7, wherein each of said spacing rails has a first end and a second end, the first end of each of said spacing rails being spaced sufficiently from the transverse slots for enabling the first ends of said spacing rails to be located within the longitudinal guide slots of said connecting rails while said transverse slots are located outside of said counting rails.

13. A container as recited in claim 7, wherein the second end of each of said spacing rails is closer to said transverse slots then the first end of each of said spacing rails so that the first end of a first group of one or more can be positioned in one or more of said longitudinal guide slots so that the printed circuit boards can be positioned on the guide slots of said first group of spacing rails, while a second group of one or more additional spacing rails are orientated 180° relative to said first group so that said group of spacing rails can be positioned on said printed circuit boards and be spaced from said connecting rails.

14. A container for rectangular printed circuit boards, said container comprising:

(a) a rectangular vertical first lower end cap;

(b) a rectangular vertical second lower end cap which is substantially the same size and shape as said first lower end cap and spaced from said first lower end cap, each of said first and second lower end caps having a pair of opposite upper corners and a pair of opposite lower corners;

(c) a vertical first upper end cap pivotally connected to one of the upper corners of said first lower end cap;

(d) a vertical second upper end cap pivotally connected to the upper corner of said second lower end cap which is directly opposite said one upper corner of said first lower end cap;

(e) a pair of parallel lower horizontal beams having first ends connected to opposite lower corners of said first lower end cap and second end connected to opposite lower corners of said second lower end cap, each of said upper beam and said lower beams having a plurality of spaced transverse slots for receiving the lower corners of printed circuit boards oriented in spaced parallel planes; said lower horizontal beams defining with said first and second lower end caps a lower container portion;

(f) an upper horizontal beam having a first end connected to said first upper end cap and a second end connected to said second upper end cap, said upper horizontal beam having a plurality of spa transverse slots for receiving an upper corner of each of said printed circuit boards, said first and second upper end caps and said upper horizontal beam being pivotally movable as a unit, relative to said first and second lower end caps, between an open position in which said upper beam is spaced above said first and second lower end caps sufficiently to enable printed circuit boards to be inserted laterally of said horizontal beams into said lower container portion and into engagement with said pair of lower horizontal beams and a closed position for enabling said upper horizontal beam to engage said printed circuit board located within said lower container portion.

15. A container as recited in claim 14, wherein said container further comprises a horizontal snugging beam connected to the upper corner of each of said upper end caps opposite said upper horizontal beam for engaging an upper corner of each printed circuit board within said container, said snugging beam having a resiliently deformable inwardly facing surface for biasing said printed circuit boards toward said horizontal beams.

16. A container as recited in claim 15, wherein said snugging beam comprises:

(a) a rigid rail fixed to each of said first and second upper end caps; and (b) a strip of resiliently deformable material fixed to said rigid rail and providing said resiliently deformable surface.

17. A container as recited in claim 14, wherein at least one of said first and second upper end caps comprises a catch for releasably holding said first and second upper end caps and said upper horizontal beam in said open position.

18. A container as recited in claim 17, wherein each of said lower end caps has a top edge and the catch for one of said upper end caps is a decent fixed to the upper end cap for engaging the top edge of the adjacent lower end cap, said decent being adapted to be forced out of holding engagement with said top edge by a predetermined downward pressure.

* * * * *